(12) United States Patent
Croysdale et al.

(10) Patent No.: US 8,429,589 B2
(45) Date of Patent: Apr. 23, 2013

(54) GENERATING NET ROUTING CONSTRAINTS FOR PLACE AND ROUTE

(75) Inventors: Kevin Croysdale, Portland, OR (US); Jason Upton, Sherwood, OR (US)

(73) Assignee: Synopsys, Inc., Mountain View, CA (US)

( * ) Notice: Subject to any disclaimer, the term of this patent is extended or adjusted under 35 U.S.C. 154(b) by 49 days.

(21) Appl. No.: 12/875,755

(22) Filed: Sep. 3, 2010

(65) Prior Publication Data

US 2011/0061037 A1 Mar. 10, 2011

Related U.S. Application Data

(60) Provisional application No. 61/240,574, filed on Sep. 8, 2009.

(51) Int. Cl.
*G06F 17/50* (2006.01)
*G06F 9/455* (2006.01)

(52) U.S. Cl.
USPC ........... 716/126; 716/129; 716/130; 716/131; 716/132; 716/135

(58) Field of Classification Search .................. None
See application file for complete search history.

(56) References Cited

U.S. PATENT DOCUMENTS

| 5,311,443 | A  | * | 5/1994  | Crain et al. .................. 716/122 |
| 6,487,705 | B1 | * | 11/2002 | Roethig et al. ............... 716/104 |
| 6,973,632 | B1 | * | 12/2005 | Brahme et al. ................ 716/113 |
| 7,149,991 | B2 | * | 12/2006 | Kovacs-Birkas et al. ..... 716/104 |
| 7,178,118 | B2 |   | 2/2007  | Ramachandran |
| 7,448,012 | B1 |   | 11/2008 | Qian |
| 8,112,733 | B2 | * | 2/2012  | Frankle et al. ................ 716/126 |
| 2004/0243964 | A1 | | 12/2004 | McElvain et al. |
| 2006/0271907 | A1 | | 11/2006 | Izuha et al. |
| 2008/0127000 | A1 | | 5/2008  | Majumder et al. |
| 2009/0254874 | A1 | * | 10/2009 | Bose .............................. 716/6 |
| 2009/0307642 | A1 | | 12/2009 | Lai et al. |
| 2009/0319977 | A1 | | 12/2009 | Saxena et al. |
| 2011/0061037 | A1 | | 3/2011  | Croysdale et al. |
| 2011/0061038 | A1 | * | 3/2011  | Qiao et al. .................... 716/126 |

OTHER PUBLICATIONS

Kundu, Sandip et al. "A Small Test Generator for Large Designs", International Test Conference, 1992 IEEE, pp. 30-40.
Zhu, Qi et al. "SAT Sweeping with Local Observability Don't-Cares", DAC 2006, Jul. 24-28, 2006, San Francisco, CA, USA, pp. 229-234.

* cited by examiner

*Primary Examiner* — A. M. Thompson
(74) *Attorney, Agent, or Firm* — Bever, Hoffman & Harms, LLP; Jeanette S. Harms

(57) ABSTRACT

A method of generating net routing constraints for nets of an IC design includes generating a file with hashes organized by nets. Each hash has attributes of a net, e.g. net name, length, fanout, total actual route (AR) resistance, a corresponding virtual route (VR) resistance, and a number of vias. A wire only AR resistance for each net can be calculated. Wire scaling factors can be calculated using the wire only AR resistances and their corresponding VR resistances. Wire scaling factors can be binned by one or more net characteristics. An average wire scaling factor can be calculated for each bin. Code used by a place and route tool can then be generated, wherein the code applies the average wire scaling factors to nets of the design to improve pre-route and post-route correlation.

28 Claims, 3 Drawing Sheets

GENERATING NET ROUTING CONSTRAINTS FOR PLACE AND ROUTE

RELATED APPLICATIONS

The present application claims priority to U.S. Provisional Patent Application 61/240,574, incorporated by reference herein, entitled "Automatic RC Pattern Scaling Generation" and filed on Sep. 8, 2009 by Kevin Croysdale and Jason Upton. The present application is related to U.S. patent application Ser. No. 12/697,142, incorporated by reference herein, entitled "Improving Pre-Route and Post-Route Net Correlation With Defined Patterns" and filed on Jan. 29, 2010 by Changge Qiao, Chi-Min Chu, and Jing C. Lin.

BACKGROUND OF THE INVENTION

1. Field of the Invention

The present invention relates to integrated circuit design optimization and in particular to generating net routing constraints for place and route, thereby improving pre-route and post-route correlation. This improved correlation results in better resource efficiency and quicker design closure.

2. Related Art

As technology nodes for integrated circuits get smaller, different parts of the design may pose significant challenges for IC designers. For example, wire delays can dominate cell delays in designs that use process technologies at 65 nm and below. Wire delay mis-correlation can be due to routing topologies, such as high fanout or congested areas of the design. Further, delay caused by via resistance can become an important issue for the 28 nm technology node and below. Currently, it is difficult to predict how many vias and what kind of vias will be used early in the design development. Yet further, lower metal layers can have 20-40 times per unit length resistance compared to higher metal layers at the 28 nm technology node and below. As a result, long nets in upper layers can have pessimistic delay estimations, and short nets in lower layers can have optimistic delay estimations.

A conventional place and route tool performs virtual (rough) routing based on an initial placement for net pins (stage referenced as "pre-route" herein). To address the above-described delay estimation issues, the conventional place and route tool uses average values for wire delays, via counts, and layer resistances. In contrast, during actual routing (stage also referenced as "post-route" herein), the conventional place and route tool uses detailed wire delays, via counts, and layer resistances, thereby generating quite accurate delay estimations. Unfortunately, to generate these delay estimations, significant system and time resources are needed. Therefore, to ensure the user is provided quick feedback on the design, virtual routing continues to use a less accurate delay model during the pre-route stage.

As a result of the above-described issues, the delay of a net assumed during circuit optimization at the pre-route stage may be very different from its actual delay after routing, thereby consequently misdirecting circuit optimization. This misdirecting may also leave critical nets un-optimized or non-critical nets over-optimized during pre-route optimization.

Therefore, a need arises for a method of improving pre-route and post-route delay correlation to provide an optimized circuit design. Because pre-route optimization is significantly more flexible than post-route optimization, post-route optimization should use limited optimization tricks to fix timing and design rule violations that cannot be easily predicted at the pre-route stage for design closure.

SUMMARY OF THE INVENTION

A method of generating net routing constraints for nets of an IC design is described. After accessing the design, a file with hashes organized by nets can be generated. Each hash has attributes of a net. Exemplary attributes of the net can include a net name, a net length, a net fanout, a total actual route resistance, a corresponding virtual route resistance, and a number of vias.

A wire only actual route resistance for each net can be calculated. Wire scaling factors can be calculated using the wire only actual route resistances and their corresponding virtual route resistances. Wire scaling factors can be binned by one or more net characteristics. An average wire scaling factor can be calculated for each bin. Code used by a place and route tool can then be generated, wherein the code applies the average wire scaling factors to nets of the design to improve pre-route and post-route correlation.

Calculating the wire only actual route resistance can include subtracting an actual routing via resistance, which is derived from the number of vias, from the total actual route resistance. Calculating a wire scaling factor for a net can include dividing its wire only actual route resistances by its corresponding virtual route resistances. Binning wire scaling factors can be done by using one or more net characteristics, e.g. net length and fanout.

Each bin can be organized as a two-dimensional array. In one embodiment, each bin can have identical wire scaling factors and the same net length and fanout. In another embodiment, binning can include merging bins having identical wire scaling factors and similar net length or fanout. In yet another embodiment, binning can include merging bins having similar wire scaling factors and similar net length or fanout. In yet another embodiment, binning can include merging bins having at least similar wire scaling factors and in-range fanout.

In one embodiment, the method can further include calculating via scaling factors using actual route vias and corresponding virtual route vias. In this embodiment, the calculated via scaling factors can be used as net characteristics for the step of binning. For example, nets having identical lengths, but considerably different via scaling factors may be considered inappropriate for merging. In another embodiment, the calculated via scaling factors can be used for refining the code used by the place and route tool.

A computer-readable storage device having computer-executable instructions for generating net routing constraints for nets of an IC design is also described. When a computer executes these instructions, the above-described steps are performed.

DETAILED DESCRIPTION OF THE FIGURES

Electronic design automation (EDA) tools can be advantageously employed to optimize integrated circuit design during placement and routing stages. In general, the optimization performed during actual routing will try to eliminate design rule violations and therefore tends to require more iterations and a longer runtime compared to the estimated routing performed during placement.

In accordance with one aspect of the invention, a limited amount of additional information at the placement optimization stage can be used to significantly improve the correlation between the estimated routing performed during placement, called virtual routing (i.e. pre-route), and actual routing (i.e. post-route). This information can include pattern-based RC scaling. As described in further detail below, pattern-based RC scaling can be applied to patterns defined by routing topology, layer assignment, and other design aspects. In one embodiment, patterns can be defined for nets showing bad pre-route and post-route correlation. In another embodiment, the patterns can be further limited to those associated with critical nets, which are identified by the user and are typically a small percentage (e.g. less than 5%) of the total number of nets.

Figure 1:
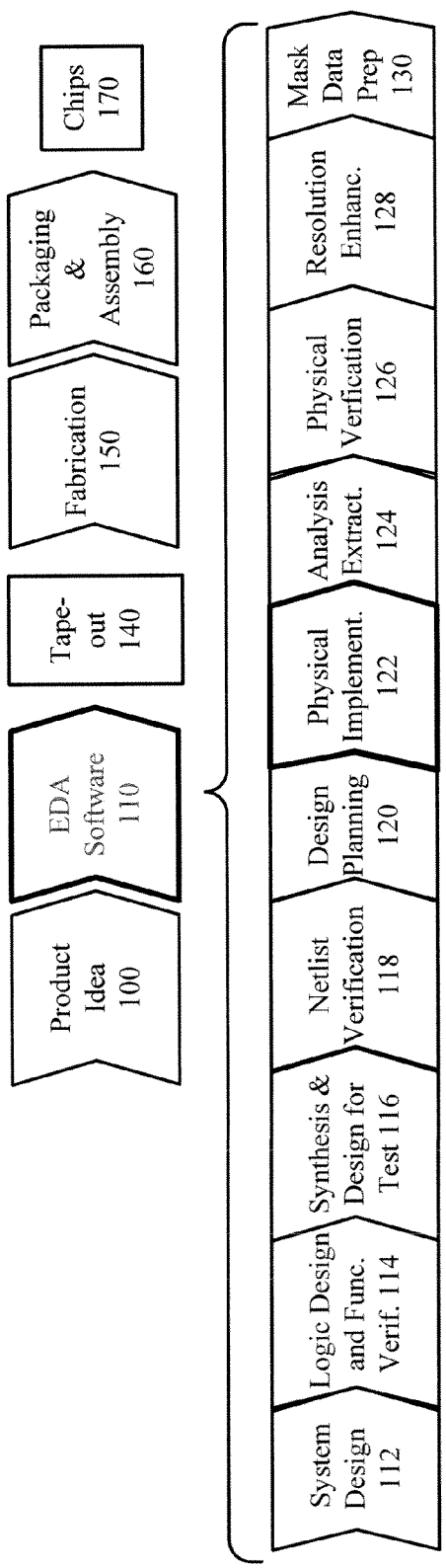
FIG. 1 illustrates a simplified representation of an exemplary digital IC design flow.

Before proceeding further with the description, it may be helpful to place this pattern-based RC scaling technique in context. FIG. 1 shows a simplified representation of an exemplary IC design flow. At a high level, the process starts with the product idea (step 100) and is realized in an EDA software design process (step 110). When the design is finalized, it can be taped-out (event 140). After tape out, the fabrication process (step 150) and packaging and assembly processes (step 160) occur resulting, ultimately, in finished chips (result 170).

The EDA software design process (step 110) is actually composed of a number of steps 112-130, shown in linear fashion for simplicity. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC.

A brief description of the components steps of the EDA software design process (step 110) will now be provided:

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional effort. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products. In one embodiment, the pattern-based RC scaling technique can be performed by the IC Compiler tool. As described in further detail below, the pattern-based RC scaling technique can advantageously use lower-effort routing results from actual routing to define and/or refine pattern-based RC scaling at the placement stage. The IC Compiler tool can perform both virtual routing, which is done at the placement stage, and actual routing of an integrated circuit design.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks for lithographic use to produce finished chips. Exemplary EDA software products from Synopsys, Inc. that can be used at this step include the CATS(R) family of products.

Pattern-Based RC Scaling

Virtual route (i.e. pre-route) net delay estimation performed at the placement stage can be enhanced by net routing constraints and/or RC scaling (also referred to as parasitic scaling in the electronic design automation (EDA) industry). In general, a scaling factor is a value that can be multiplied with the capacitance and/or resistance of a net matching a pattern to promote better design optimization.

The parasitics of nets that match a pattern can be manipulated in two ways. First, RC scaling factors can be set based on minimum and maximum as well as horizontal and vertical variables associated with capacitance and resistance. In one embodiment, an RC scaling factor for via count can also be set. In another embodiment, a more precise delay calculation model, e.g. AWE, can also be set.

Nets that match a pattern can also be subject to net routing constraints, which can include non-default routing rules and/or routing layer constraints. The non-default routing rules can refer to double width nets, double spacing between nets, tapering rules (with nets of varying widths), via cuts (wherein a default via normally has one cut and any additional cut can further reduce the via resistance), non-default vias, and other patterns of particular interest. The routing layer constraints can refer to minimum routing layer constraints and/or maximum routing layer constraints. In one embodiment, the net routing constraints can be user-generated.

In one embodiment, the routing constraint assignments do not explicitly assign specific resistances and capacitances; however, a routing constraint assignment to a non-default routing rule and/or a minimum or maximum layer of an integrated circuit implicitly has both resistance and capacitance that can be derived from these routing constraints.

In one embodiment, the net routing constraints can be given priority over the scaling factors. In this case, during pattern matching, when a net matches a pattern, then a net routing constraint will be applied and the scaling factors are ignored.

Patterns in a design can be defined using, for example, number of fanouts, congestion, a net bounding box (minimum or maximum size, or aspect ratio), slack (minimum or maximum value), and various combinations of the above factors.

Figure 2:
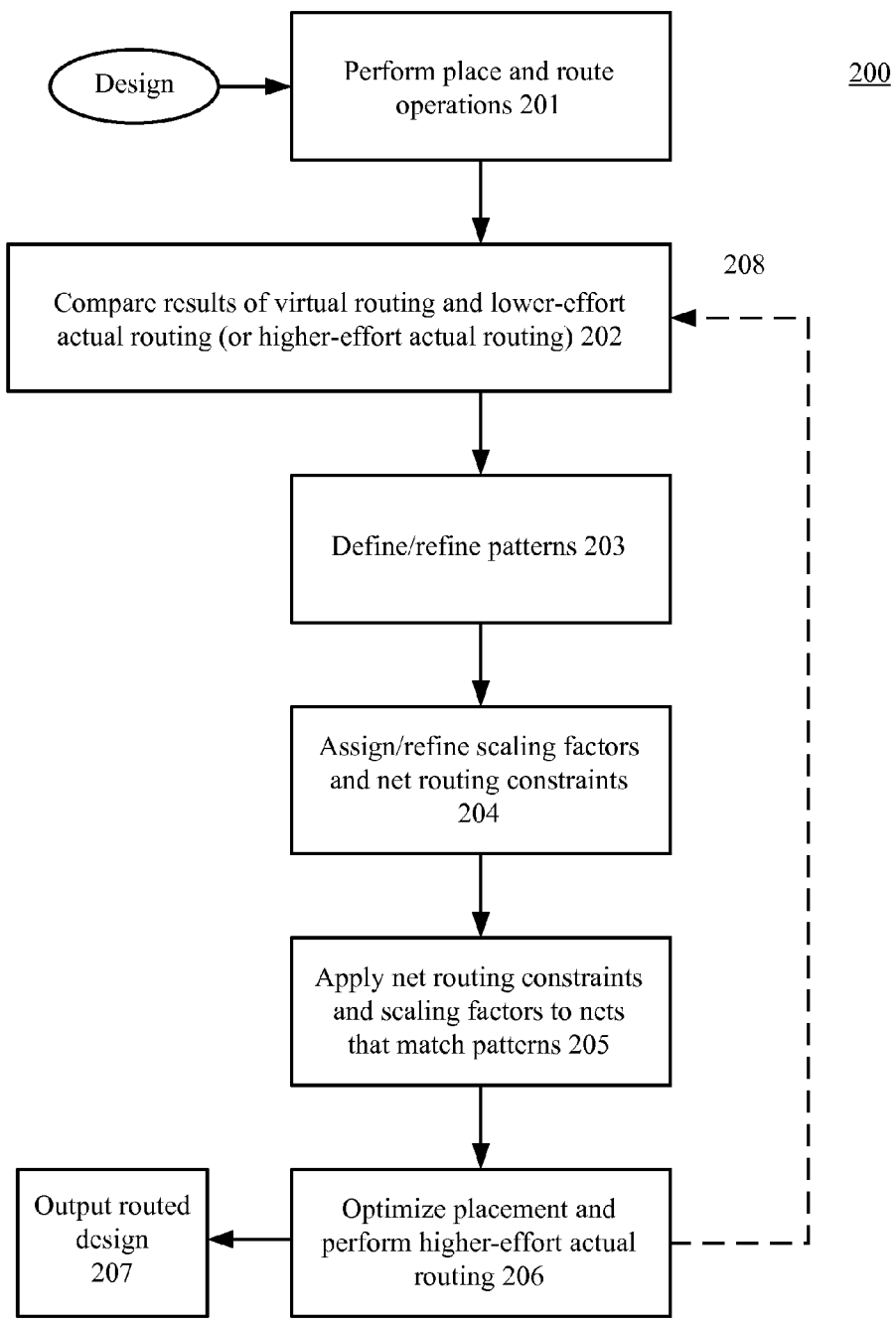
FIG. 2 illustrates an exemplary technique including pattern-based RC scaling.

FIG. 2 illustrates an exemplary technique 200 for generating the pattern-based net routing constraints and/or RC scaling factors, and then applying those net routing constraints and/or RC scaling factors to nets of an integrated circuit design. Step 201 can run a rough place and route of an accessed design. Note that a place and route tool can generally perform both virtual routing and actual routing. Moreover, actual routing can be performed with varying degrees of effort (e.g. low, medium, or high) using tool commands. In one preferred embodiment, the routing performed in step 201 includes virtual routing and low-effort actual routing, thereby minimizing runtime.

Step 202 can compare the results of the virtual routing and the low-effort actual routing of the design. This comparison can be done by analyzing real (albeit low effort) and estimated parasitics, resistances, and via counts. In one embodiment using an exemplary place and route tool, e.g. IC Compiler, step 202 can use the compare_rc, compare_rc-resistance, and compare_rc-only_via_count commands. In one embodiment, step 202 can also include performing the compare_rc subroutine for specific patterns (e.g. using a compare_rc-pattern <pattern_id> command).

In step 204, the net routing constraints and/or RC scaling factors for the defined patterns can be assigned (e.g. using the set_pattern_delay_estimation_options command). After the net routing constraints and/or RC scaling factors for the defined patterns are assigned, step 205 can apply those net routing constraints and/or RC scaling factors to nets of the design that match the defined patterns.

In one embodiment, each net is checked against all of the criteria of the defined patterns. For example, to meet fanout criteria, the fanout number must be greater than or equal to the set threshold (when set) and must be smaller than the bound (when set). In other words, if one parameter is not specified, then that parameter is not checked. Using the fanout example above, if the fanout_threshold is set, but not the fanout_bound, then all nets with fanouts greater than or equal to the fanout threshold are considered matches.

In one embodiment of step 204, the patterns can be checked for matching in a predetermined order for each net. For example, the predetermined order can follow the pattern identification (ID) in numerical order. In general, once a match with one pattern is found, pattern checking for that net ends. In one embodiment, the user can specify the predetermined order for pattern checking. For example, if patterns 1-5 are defined and the user specifies a pattern check order of "3 5 2", then the pattern check order will be "3 5 2 1 4".

Step 206 can optimize placement and perform higher-effort routing (i.e. higher effort than the lower-effort actual routing) using the net routing constraints and RC scaling factors. Note that the RC scaling factors are not used during actual routing, but can advantageously be used during placement optimization. Step 207 can output a routed integrated circuit design.

In contrast, in step 206, the higher-effort routing can advantageously include net routing constraints associated with nets matching the defined patterns. For example, routing guidance can advantageously include non-default routing rules and routing layer constraints. Thus, if a user generates a pattern for a specific net length and assigns a specific layer for that defined pattern, then that routing layer constraint should be maintained throughout placement and actual routing in step 206. This type of constraint inheritance is desirable because of the operation of the place and route tool. That is, based on a certain net length, the place and route tool may insert one or more buffers to ensure good signal transmission. However, this buffer insertion can result in two or more nets of significantly shorter length compared to the original net. At this point, using the shorter nets, the net routing constraint may not be applied to the newly-created nets. Therefore, any net routing constraints should be maintained for routing optimization, such as buffer insertion, buffer removal, and high fanout net synthesis, in step 206.

As a result, these non-default routing rules and routing layer constraints can be characterized as being "sticky" because they are maintained and passed to the router in step 206. Note that such "inherited" net constraints can tradeoff with buffering to optimize cell count, density, and/or congestion.

In one embodiment, the routing results from step 206 can be fed back to step 202 via loop 208. For example, if the higher-effort routing performed in step 206 (first instance) is at a "medium" effort level, then loop 208 can be used for yet further refinement of the pre-route and post-route correlation by comparing the higher-effort actual routing with virtual routing in step 202. Note that the refinement of the net routing constraints and/or RC scaling factors can change the current placement, thereby also changing the actual routing performed in step 206. In one embodiment, steps 202-206 can be repeated until a predetermined correlation is achieved or the user requests the routed design in step 207. In one embodiment, the higher-effort actual routing performed in step 202 remains at the same level. For example, if the higher-effort actual routing is at the medium effort level in step 202 (first instance), then any subsequent instances of step 202 are also performed using the medium effort actual routing.

Note that in some embodiments, the scaling factors, non-default routing rules, and routing layer constraints of one design can be used for multiple designs (i.e. performing steps 201-204 for one design and steps 205-207 for one or more other designs). This multi-use may be possible for designs having a common technology node, similar cell utilization, and/or floor plans.

Note that step 202 uses a delay model for virtual routing. The Elmore delay model is used by conventional pre-route estimation because of the quick run time. However, the Elmore delay model may be too pessimistic for certain cases. Therefore, in one embodiment, a more precise delay model can be used in step 202.

Figure 3:
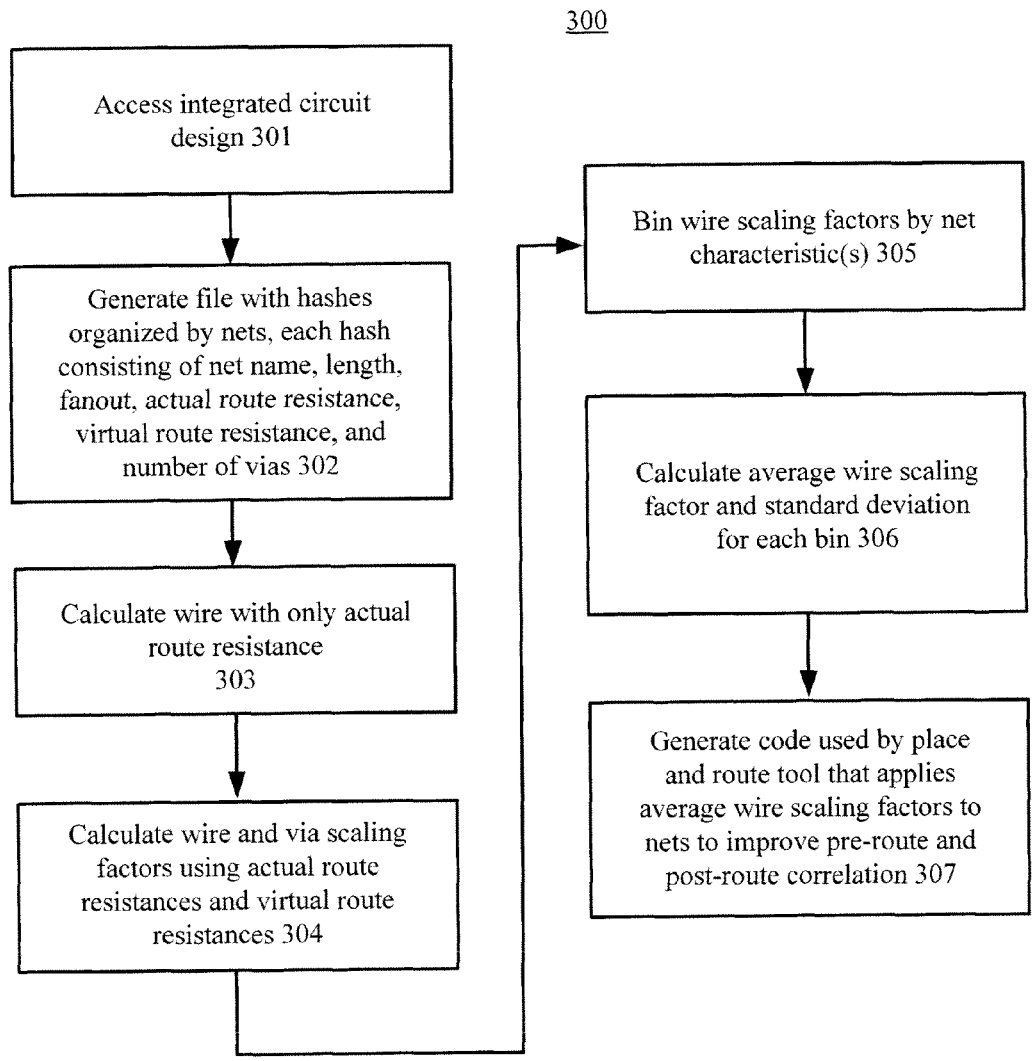
FIG. 3 illustrates one scaling factor computation technique.

FIG. 3 illustrates one scaling factor computation technique 300 that can be performed in steps 203 and 204. In technique 300, step 301 can access an IC design. In one embodiment, a tool from Synopsys, Inc., e.g. IC Compiler, can access a standard netlist, which describes an IC design. Based on that IC description, step 302 can generate a file including a plurality of hashes organized by nets, wherein each hash consists of attributes of a net. In one embodiment, the attributes can include a net name, a length, a fanout, a total actual route (AR) resistance, a total virtual route (VR) resistance, and a number of vias. Note that these resistance attributes can be generated by a standard place and route tool.

Step 303 can calculate the wire only AR resistance. In one embodiment, the calculation of the wire only AR resistance can be performed by subtracting the AR via resistance from the total AR resistance (wherein total resistance=wire resistance+via resistance):

$$AR\_resistance_w = Actual\_resistance_{wv} - Actual\_resistance_v$$

wherein w=wire only, wv=wire+via, and v=via only.

Note that once a number of vias for a net is determined, via resistance can be computed by multiplying that number by a known resistance for one via (e.g. based on technology node, via composition, and design for manufacturability (DFM) rules). In one embodiment, VR_resistance$_w$ can be computed in a similar manner, i.e. subtracting the VR via resistance from the total VR resistance.

$$VR\_resistance_w = Virtual\_resistance_{wv} - Virtual\_resistance_v$$

Step 304 can calculate the wire scaling factor for each net as follows:

$$wire\_scale\_factor = AR\_resistance_w / VR\_resistance_w$$

In one embodiment, step 304 can also calculate the via scaling factor for each net as follows:

$$via\_scale\_factor = AR\_resistance_v / VR\_resistance_v$$

Step 305 can bin wire scaling factors by one or more net characteristics. In one embodiment, the net characteristics can be net length and fanout. Note that step 305 can include multiple loops that can merge multiple bins. For example, in a first loop, only identical scaling factors having the same net length and fanout can be placed in the same bin. In a second loop, similar scaling factors having similar net length and fanout can be placed in the same bin. In one embodiment, similar scaling factors can be those within a predetermined range of each other. For example, consider three original bins A, B, and C having the same net length and fanout, but having resistance scaling factors of "1", "2", and "3", respectively. If the predetermined range is "2", then bins A, B, and C can be merged into one bin in the second loop of step 305. The predetermined range can vary based on technology node and fab processing.

Step 305 can also merge bins having different net lengths, but having identical/similar scaling factors. In one embodiment, merging based on net length can be done by considering bin size. For example, if bin B has 1000 hashes with net length N, bin C has 2 hashes with net length N+10, and bin D has 1000 hashes with net length 2N, then bins B and C can be merged when bins B and C have identical or similar scaling factors. In one embodiment, step 305 can initiate binning using a minimum bin size and can merge bins until (1) a predetermined number of bins remain or (2) the remaining bins have non-similar scaling factors (i.e. outside the predetermined range).

In one embodiment, identical/similar scaling factors with different fanouts remain in different bins, i.e. are not merged. In another embodiment, identical/similar scaling factors with different fanouts can be merged. For example, bins having 0-10 fanouts, 11-20 fanouts, etc. can be created.

In one embodiment, the calculated via scaling factors can be used as an additional net characteristic for binning in step 305. For example, when two bins are being considered for merging, the via scaling factors associated with the nets of two bins can determine whether merging is appropriate (e.g. identical wire lengths, but considerably different via scaling factors would counsel against merging bins).

In another embodiment, the via scaling factors calculated in step 304 can be used in step 307 to improve correlation. Specifically, the place and route tool would typically assume a value for via resistance of a particular net (e.g. one via for each end of the net). By calculating via scaling factors in step 304, a more accurate value (e.g. associated with a specific metal layer) can be used for each net, thereby allowing further refinement of the code in step 307 for improving the pre-route and post-route correlation.

In one embodiment, each bin is organized as a two-dimensional array, first by fanout and then by net length. In another embodiment, each bin is organized as a three-dimensional array using fanout, net length, and aspect ratio (or slack). In yet another embodiment, each bin is organized as a four-dimensional array using fanout, net length, aspect ratio, and slack. Notably, reducing the number of bins, whether by bin size, net length, or fanout, can advantageously reduce the complexity because hashes in one bin can be similarly treated/analyzed, thereby improving the performance and runtime of the place and route tool.

In one embodiment, the net information can be eliminated by the end of step 305. That is, hashes in a bin merely have fanout and net length and are no longer are organized by net name. In another embodiment, particularly where bins are merged with the number of hashes in each bin being substantially different, pointers can be established to more accurately calculate an average scaling factor (step 306, described below).

For each bin, step 306 can calculate an average wire scaling factor and standard deviation. For example, if a bin has 5 hashes having the scaling factors 2, 3.1, 4, 2.2, and 3.7, then the average scaling factor can be computed by adding the scaling factors and dividing by the number of scaling factors, i.e. (2+3.1+4+2.2+3.7)/5=3. In this case, the standard deviation is approximately 0.76 (i.e. list of deviations: −1, 0.1, 1, −0.8, 0.7; squares of deviations: 1, 0.01, 1, 0.16, 0.14; sum of deviations: 2.31; divided by one less than number of scaling factors: 2.31/4=0.5775; square root: approximately 0.76). Note that the standard deviation can be used for reporting purposes to demonstrate the relative quality of the bins, i.e. a large standard deviation associated with a bin would indicate that the nets of that bin are not closely related.

Step 307 can generate the software code, i.e. the script, that applies the patterns in the tool (e.g. IC Compiler). In one embodiment, four sets of data can be used for calculating the software code: resistance value comparison report with and without vias, capacitance value comparison report, virtual versus detail route net length comparison file, and routed net lengths and via usage report.

The pattern-based RC scaling technique can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ICs).

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. For example, note that pattern-based RC scaling technique can be updated throughout place and route operations. Further note that although step 202 refers to a lower-effort actual routing and step 206 refers to a higher-effort actual routing, this distinction can also be characterized as a first-type actual routing and a second-type actual routing, wherein the iterations used by the second-type actual routing are greater than the iterations used by the first-type actual routing. Accordingly, it is intended that the scope of the invention be defined by the following Claims and their equivalents.

The invention claimed is:

1. A method of generating net routing constraints for nets of a design for an integrated circuit, the method comprising:
   accessing the design;
   generating a file with hashes organized by nets;
   calculating a wire only actual route resistance for each net;
   calculating wire scaling factors using the wire only actual route resistances and corresponding virtual route resistances;
   binning wire scaling factors by one or more net characteristics into a plurality of bins;
   calculating an average wire scaling factor for each bin; and
   using a computer, generating code used by a place and route tool, the code applying average wire scaling factors to nets of the design to improve pre-route and post-route correlation.

2. The method of claim 1, wherein accessing the design includes accessing an integrated circuit (IC) description, and wherein generating the file is based on the IC description, each hash having attributes of a net of the design.

3. The method of claim 2, wherein the attributes of the net include a net name, a net length, a net fanout, a total actual route resistance, a corresponding virtual route resistance, and a number of vias.

4. The method of claim 3, wherein calculating the wire only actual route resistance includes subtracting an actual routing via resistance, which is derived from the number of vias, from the total actual route resistance.

5. The method of claim 4, wherein calculating the wire scaling factor for a net includes dividing its wire only actual route resistances by its corresponding virtual route resistances.

6. The method of claim 5, wherein binning wire scaling factors is done by using one or more net characteristics.

7. The method of claim 6, wherein the one or more net characteristics include net length and fanout.

8. The method of claim 7, wherein each bin has identical wire scaling factors and same net length and fanout.

9. The method of claim 7, wherein binning includes merging bins having identical wire scaling factors and similar net length or fanout.

10. The method of claim 7, wherein binning includes merging bins having similar wire scaling factors and similar net length or fanout.

11. The method of claim 7, wherein binning includes merging bins having at least similar wire scaling factors and in-range fanout.

12. The method of claim 6, wherein the binning includes organizing each bin as a two-dimensional array.

13. The method of claim 1, further including calculating via scaling factors using actual route vias and corresponding virtual route vias, wherein via scaling factors are used as net characteristics for binning.

14. The method of claim 1, further including calculating via scaling factors using actual route vias and corresponding virtual route vias, wherein via scaling factors are used for refining the code used by the place and route tool.

15. A computer-readable storage device having computer-executable instructions for generating net routing constraints for nets of a design for an integrated circuit, which when executed by a computer performs steps comprising:
   accessing the design;
   generating a file with hashes organized by nets;
   calculating a wire only actual route resistance for each net;
   calculating wire scaling factors using the wire only actual route resistances and corresponding virtual route resistances;
   binning wire scaling factors by one or more net characteristics into a plurality of bins;
   calculating an average wire scaling factor for each bin; and
   generating code used by a place and route tool, the code applying average wire scaling factors to nets of the design to improve pre-route and post-route correlation.

16. The computer-readable storage device of claim 15, wherein each hash has attributes of a net.

17. The computer-readable storage device of claim 16, wherein the attributes of the net include a net name, a net length, a net fanout, a total actual route resistance, a corresponding virtual route resistance, and a number of vias.

18. The computer-readable storage device of claim 17, wherein calculating the wire only actual route resistance includes subtracting an actual routing via resistance, which is derived from the number of vias, from the total actual route resistance.

19. The computer-readable storage device of claim 18, wherein calculating the wire scaling factor for a net includes dividing its wire only actual route resistances by its corresponding virtual route resistances.

20. The computer-readable storage device of claim 19, wherein binning wire scaling factors is done by using one or more net characteristics.

21. The computer-readable storage device of claim 20, wherein the one or more net characteristics include net length and fanout.

22. The computer-readable storage device of claim 21, wherein the binning includes providing identical wire scaling factors and same net length and fanout for each bin.

23. The computer-readable storage device of claim 21, wherein binning includes merging bins having identical wire scaling factors and similar net length or fanout.

24. The computer-readable storage device of claim 21, wherein binning includes merging bins having similar wire scaling factors and similar net length or fanout.

25. The computer-readable storage device of claim 21, wherein binning includes merging bins having at least similar wire scaling factors and in-range fanout.

26. The computer-readable storage device of claim 21, further including organizing each bin as a two-dimensional array.

27. The computer-readable storage device of claim 15, further including calculating via scaling factors using actual route vias and corresponding virtual route vias, wherein via scaling factors are used as net characteristics for binning.

28. The computer-readable storage device of claim 15, further including calculating via scaling factors using actual route vias and corresponding virtual route vias, wherein via scaling factors are used for refining the code used by the place and route tool.

* * * * *